United States Patent
Bez et al.

(10) Patent No.: US 6,750,505 B2
(45) Date of Patent: Jun. 15, 2004

(54) NON-VOLATILE MEMORY CELL WITH FLOATING GATE REGION AUTOALIGNED TO THE ISOLATION AND WITH A HIGH COUPLING COEFFICIENT

(75) Inventors: Roberto Bez, Milan (IT); Emilio Camerlenghi, Bergamo (IT); Stefano Ratti, San Donato Milanese (IT)

(73) Assignee: StMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 10/337,556

(22) Filed: Jan. 7, 2003

(65) Prior Publication Data

US 2003/0096477 A1 May 22, 2003

Related U.S. Application Data

(62) Division of application No. 09/900,501, filed on Jul. 6, 2001, now Pat. No. 6,537,879.

(30) Foreign Application Priority Data

Jul. 11, 2000 (IT) .................................. MI2000A1567

(51) Int. Cl.$^7$ ............................................. H01L 29/788
(52) U.S. Cl. ............................................................ 257/315
(58) Field of Search ................................. 257/239, 261, 257/314, 315, 317, E29.129, E29.3

(56) References Cited

U.S. PATENT DOCUMENTS

| 6,140,184 A | * 10/2000 | Dupuy et al. ............... 438/275 |
| 6,171,909 B1 | 1/2001 | Ding et al. ................. 438/267 |
| 6,235,589 B1 | 5/2001 | Meguro ....................... 438/267 |
| 6,326,263 B1 | 12/2001 | Hsieh .......................... 438/257 |

* cited by examiner

*Primary Examiner*—Craig A. Thompson
(74) *Attorney, Agent, or Firm*—Lisa K. Jorgenson; Allen, Dyer, Doppelt, Milbrath & Gilchrist, P.A.

(57) ABSTRACT

A process for fabricating non-volatile memory cells on a semiconductor substrate includes forming a stack structure comprised of a first polysilicon layer isolated from the substrate by an oxide layer. The first polysilicon layer, oxide layer, and semiconductor substrate are cascade etched to define a first portion of a floating gate region of the cell and at least one trench bordering an active area of the memory cell. The at least one trench is filled with an isolation layer. The process further includes depositing a second polysilicon layer onto the whole exposed surface of the semiconductor, and etching the second polysilicon layer to expose the floating gate region formed in the first polysilicon layer, thereby forming extensions adjacent the above portion of the first polysilicon layer.

9 Claims, 7 Drawing Sheets

NON-VOLATILE MEMORY CELL WITH FLOATING GATE REGION AUTOALIGNED TO THE ISOLATION AND WITH A HIGH COUPLING COEFFICIENT

This application is a divisional of Ser. No. 09/900,501 filed on Jul. 6, 2001, now U.S. Pat. No. 6,537,879 the disclosure of which is hereby incorporated by reference in its entirety.

FIELD OF THE INVENTION

The present invention relates to a process for fabricating a non-volatile memory cell having a floating gate region self-aligned to the insulator, and having a high coefficient of coupling. The present invention relates more particularly, but not exclusively, to a process for fabricating a nonvolatile EPROM or flash EPROM cell.

BACKGROUND OF THE INVENTION

As is well known, EPROM or flash EPROM type electronic memory devices are integrated in a semiconductor material and comprise a plurality of non-volatile memory cells arranged in a matrix array. The non-volatile memory cells each comprises a MOS transistor having a gate region located above the channel region which is floating, i.e., it has a high DC impedance to all the other terminals of the cell and the circuit wherein the cell is incorporated. The cell also has a second region, known as the control gate, which is driven by suitable control voltages. The other electrodes of the transistor are the standard drain, source, and body terminals.

There has been considerable effort in the last few years to develop memory devices with ever higher rates of circuit density. A continuing miniaturization of the cell, essential to an increased integration density, has led to a substantial reduction in the characteristic parameters of non-volatile memory cells, e.g., in the area occupied by the elementary unit that is repeated to make up the array.

Area occupation is defined as the product of the y-pitch and x-pitch (see FIG. 1), i.e., the cell dimensions along respective y and x directions in a horizontal plane. For a memory cell, e.g., of the conventional NOR type used in EPROM and flash type memories, the y-pitch dimension is given by the sum of the cell half-contact dimension, the distance from the contact to the gate region, the length dimension of the gate region and the half-sourceline.

The x-pitch dimension is given by the width of the memory cell active area, or the dimension of the floating gate region, plus the respective distance. Limiting factors to a reduction of the x-pitch dimension are the resolution of the fabricating process and, therefore, in defining the floating gate region, the alignment tolerances of the floating gate region to the active area.

A recent Toshiba publication (K. Imamiya et al., "A 130 mm 256 Mb NAND Flash with Shallow Trench Isolation Technology", MP 6.6, IEEE ISSCC, 1999) describes a memory cell having its floating gate region self-aligned to the isolation layers. Although advantageous on several counts, this approach has some drawbacks. In fact, it does not solve the problem of providing a good capacitive coupling between the control gate and the floating gate region. The coupling could be improved by extending the floating gate region to overlie the layer of field oxide that surrounds the active area of the cell along the x direction. However, several polysilicon layers would have to be aligned to the active area to achieve such an improved capacitive coupling.

This structure formation adds problems of alignment and photolithography tolerance to the process steps.

SUMMARY OF THE INVENTION

In view of the foregoing background, an object of the present invention is to provide a memory device and process for fabricating a non-volatile memory cell of the memory device, whereby a floating gate region can be obtained which is self-aligned to the active area of the cell, and whereby the coupling area between the floating gate region and the control gate region can be enhanced. Accordingly, this process should have appropriate structural characteristics to overcome the limitations and drawbacks of the prior art.

This and other objects, advantages and features in accordance with the present invention are provided by a floating gate region formed by a double deposition of polycrystalline silicon (polysilicon), wherein the first deposition allows the floating gate region to be self-aligned to the active area, while the second deposition allows the surface of the floating gate region to be extended as much as possible in the x direction of the cell without presenting lithography alignment problems.

More particularly, the invention is directed to a memory device or integrated circuit that may include a floating gate defined by a stacked structure comprising a first dielectric layer, and a first conducting layer isolated from the substrate by the first dielectric layer, at least one trench in the substrate adjacent the floating gate, and a second dielectric layer in the at least one trench. Moreover, the memory device may also include conductive extensions contacting the first conducting layer of the floating gate and extending laterally outwardly therefrom over adjacent portions of the second dielectric layer. The conductive extensions may have upper surface portions being substantially coplanar with adjacent upper surface portions of the first conducting layer of the floating gate. In addition, the conductive extensions may have a thickness substantially equal to a thickness of the first conducting layer of the floating gate.

The conductive extensions may each comprise a second conducting layer, and the first and second conducting layers may each comprise polysilicon. The first and second dielectric layers may each comprises silicon oxide. The at least one trench may have sloping sidewalls, having, for example, a slope angle in a range of about 60 to 90 degrees with respect to the substrate.

BRIEF DESCRIPTION OF THE DRAWINGS

The features and advantages of the process according to the invention will be apparent from the following description of an embodiment thereof, given by way of a non-limitative example with reference to the accompanying drawings.

DETAILED DESCRIPTION OF THE PREFERRED EMBODIMENTS

Figure 1:
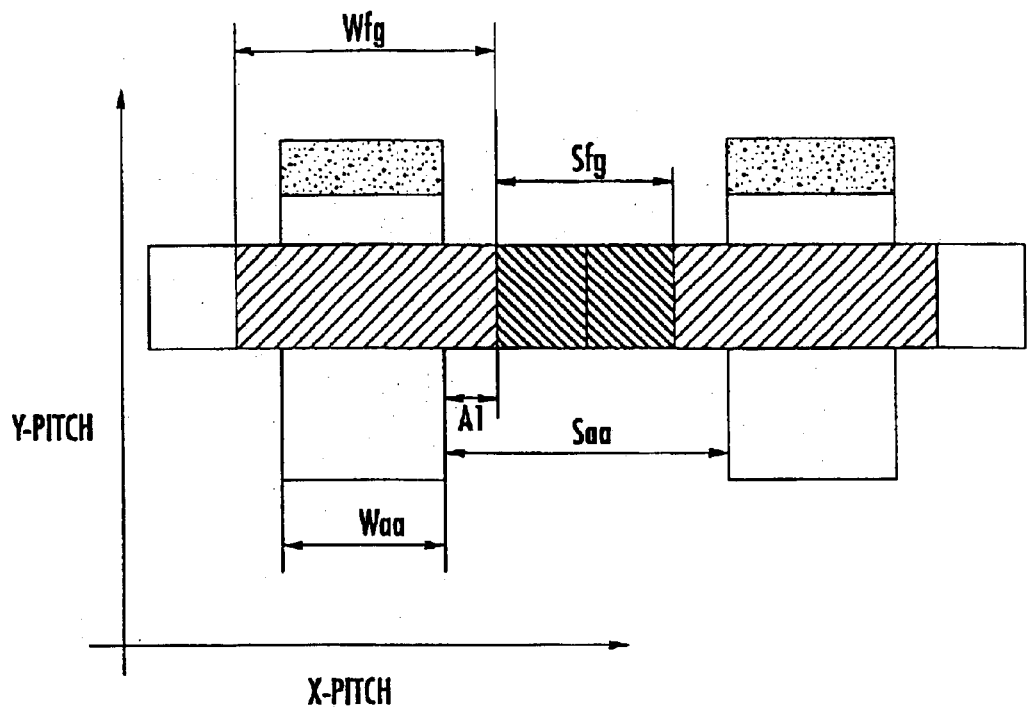
FIG. 1 is a schematic top plan view of a cell obtained by the process according to the present invention.
Figure 2:
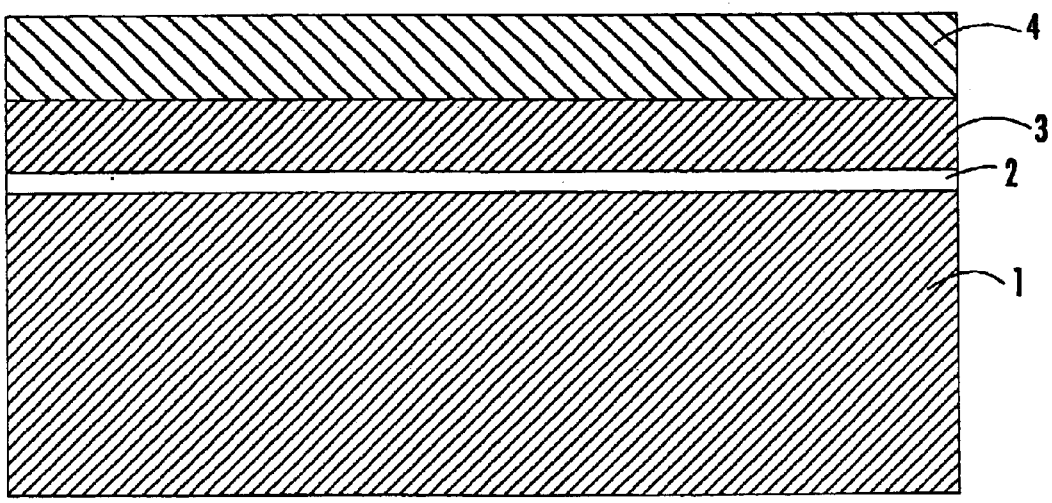
FIGS. 2 to 13 are respective vertical cross-section views, drawn to an enlarged scale, of a portion of a semiconductor substrate during different steps of the fabrication process according to the present invention.
Figure 3:
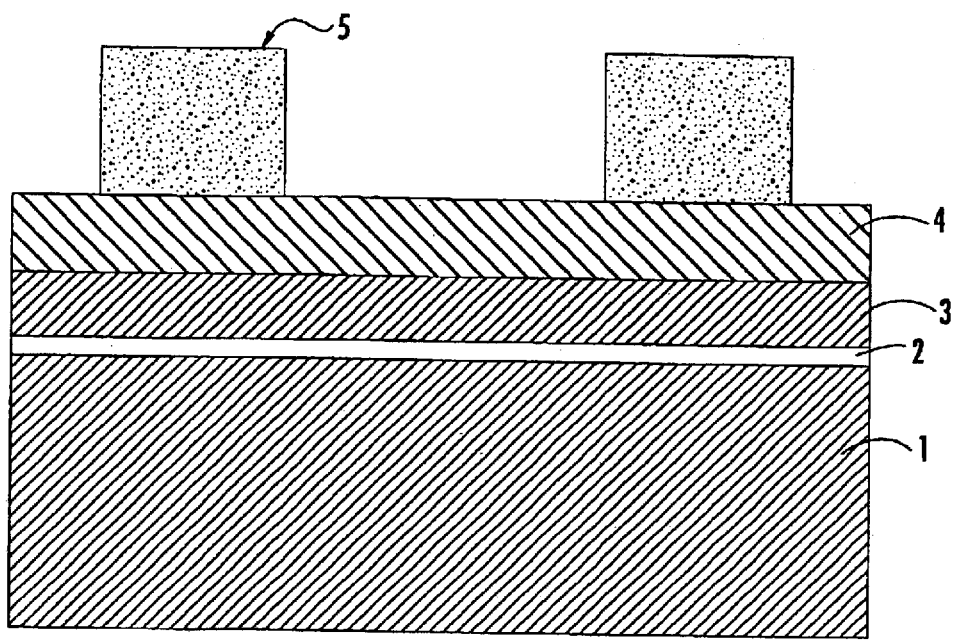
Figure 4:
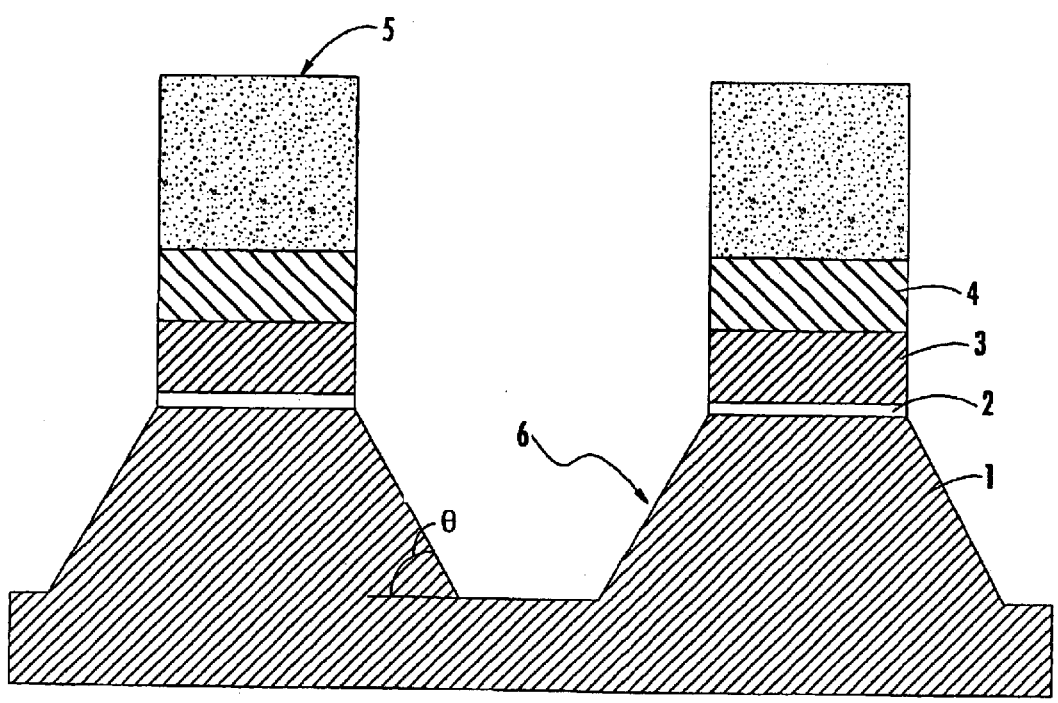
Figure 5:
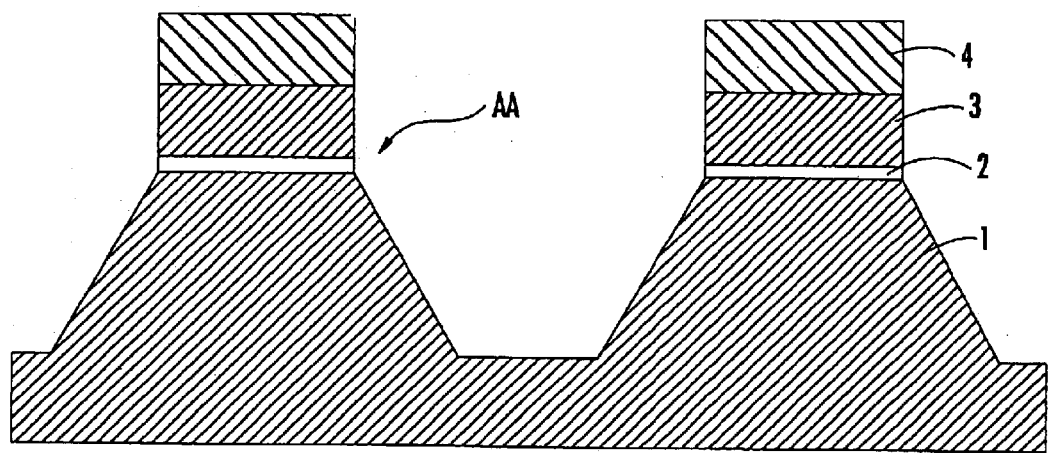

A process for fabricating a non-volatile memory cell having a floating gate region self-aligned to the insulator, and having a high coefficient of coupling, will now be described with reference to the drawings. A stack structure made up of an oxide layer 2, a polysilicon layer 3, and a nitride layer 4 is formed over a substrate 1 of silicon. The nitride layer 4, however, could be omitted. The polysilicon layer 3 would then be made thicker.

Advantageously, the oxide layer 2 and polycrystalline silicon layer 3 provide the gate oxide layer (or the so-called tunnel oxide if the cell is a flash type) and the floating gate region of the cell. In the prior art, this stack structure was usually formed by sacrificial layers, which are removed after use.

In a preferred embodiment, the thickness dimensions may be, for example, from a few units to a few tens of nanometers (e.g., 8 to 12 nm) for the oxide layer 2; a few hundreds of nanometers (e.g., 100 to 150 nm) for the polysilicon layer 3; and a few hundreds of nanometers (e.g., 100 to 200 nm) for the nitride layer 4.

Thereafter, a layer 5 of a photo-sensitive material, such as a resist, is deposited onto the whole exposed surface. Using conventional exposure and development techniques, this layer 5 is patterned to provide a mask approaching in size the active area AA of the cell to be obtained.

The nitride layer 4, if there, and the polysilicon layer 3 and oxide layer 2 are then etched in cascade. This etching is continued to form a trench 6 in the semiconductor layer 1 and to define the active area AA of the memory cell. Advantageously, the trench 6 will have sloping sidewalls at an angle θ from the surface plane. The angle θ may vary between 60 and 90 degrees (and is typically 75–85 degrees).

Throughout the next drawing views, the trench 6 is shown as having sloping sidewalls, but it should be understood that the trench 6 may be formed with vertical sidewalls. The depth of the trench in the semiconductor substrate 1 is a few hundred nanometers, e.g., about 300 nm.

Figure 6:
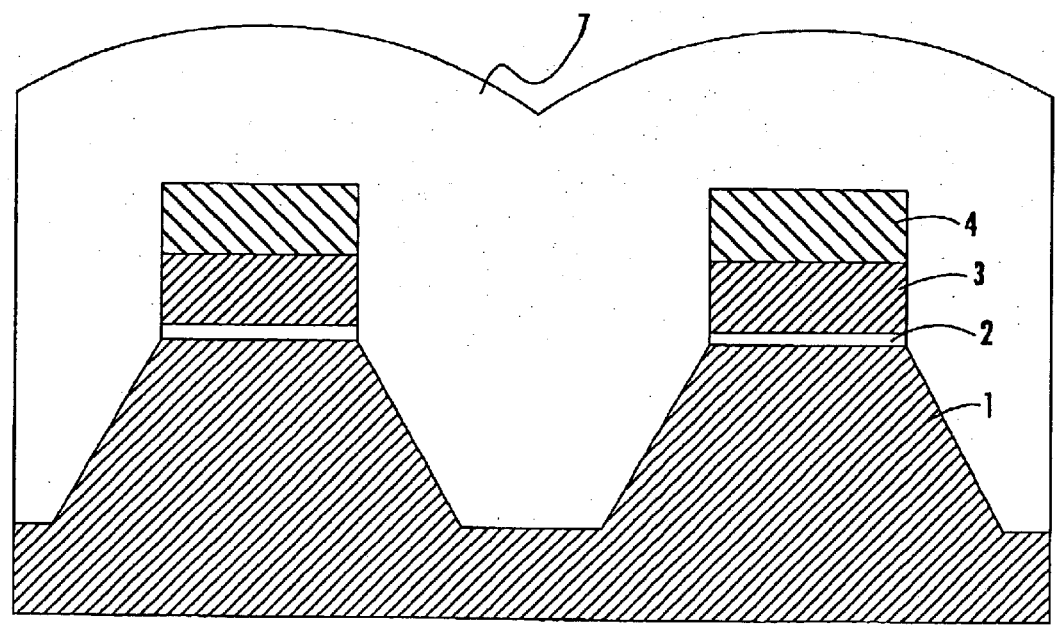
Figure 7:
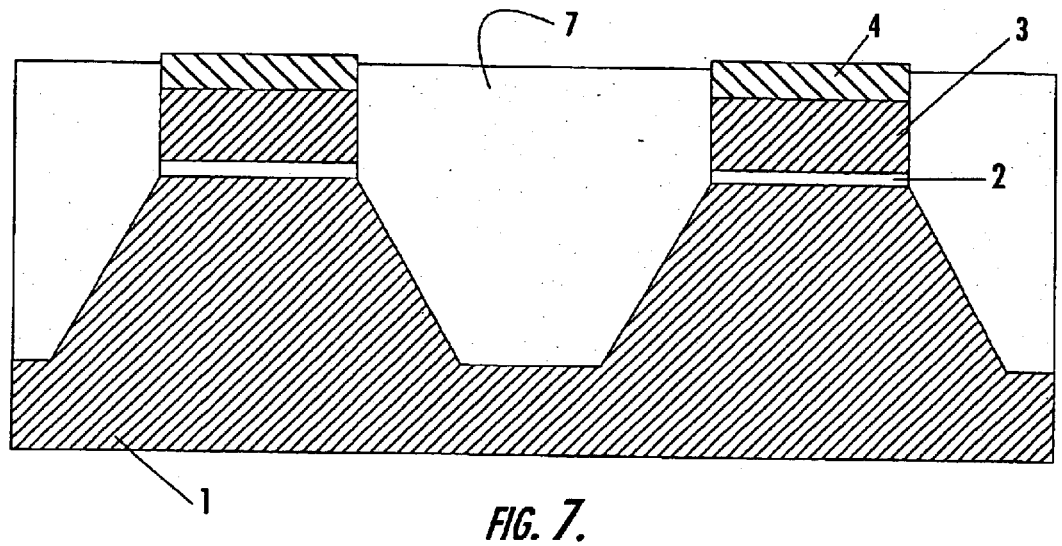
Figure 8:
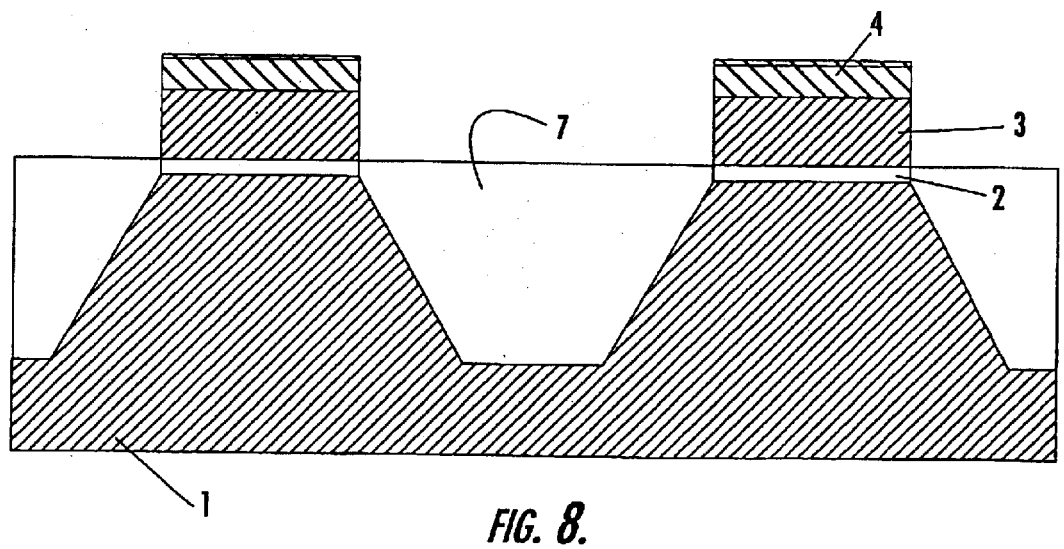

The layer 5 of photo-sensitive material is then removed, and an isolation layer 7 is formed to fill the trench 6 and isolate adjacent stack structures from one another. This isolation layer 7 is made sufficiently thick to at least partly planarize the structure at this step of its fabrication, as shown in FIG. 6. The isolation layer 7 may be an oxide layer deposited by a CVD method.

The process of the present invention also comprises the following steps. The surface of the structure is further planarized, e.g., by a chemical mechanical polishing (CMP) technique, to expose the nitride layer 4. The oxide layer 7 is then etched away for a thickness equal to the combined thicknesses of the nitride layer 4 and the polysilicon layer 3. This etching is maintained until the thin oxide layer 2 is exposed, but should never go deeper than layer 2.

Figure 9:
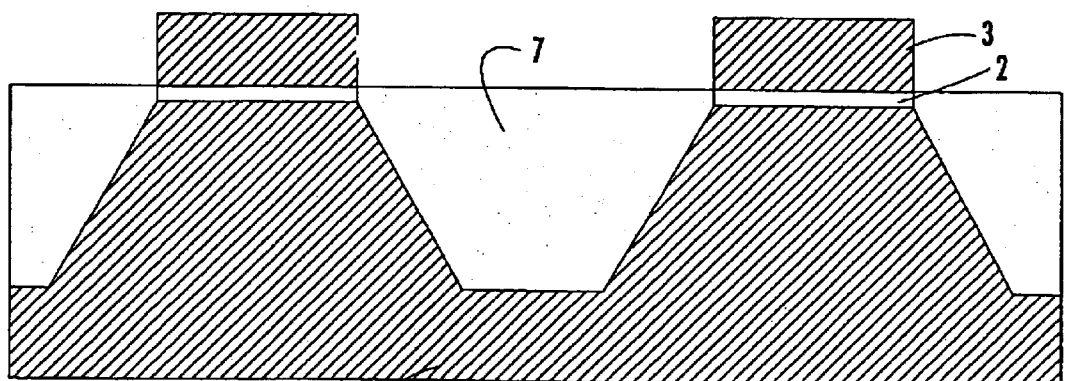
Figure 10:
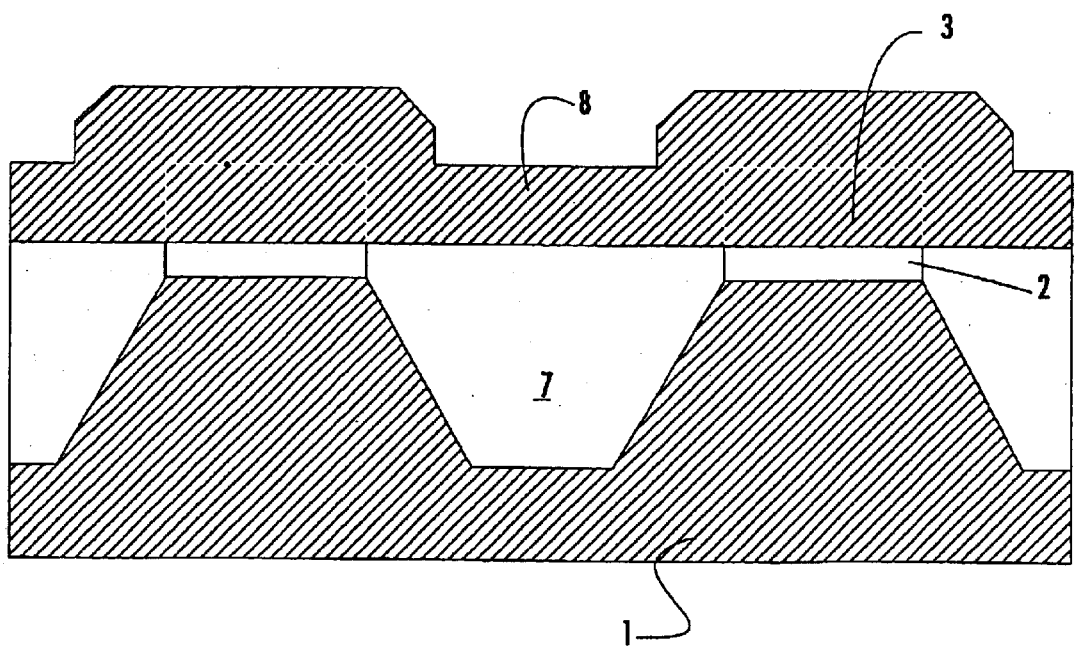
Figure 11:
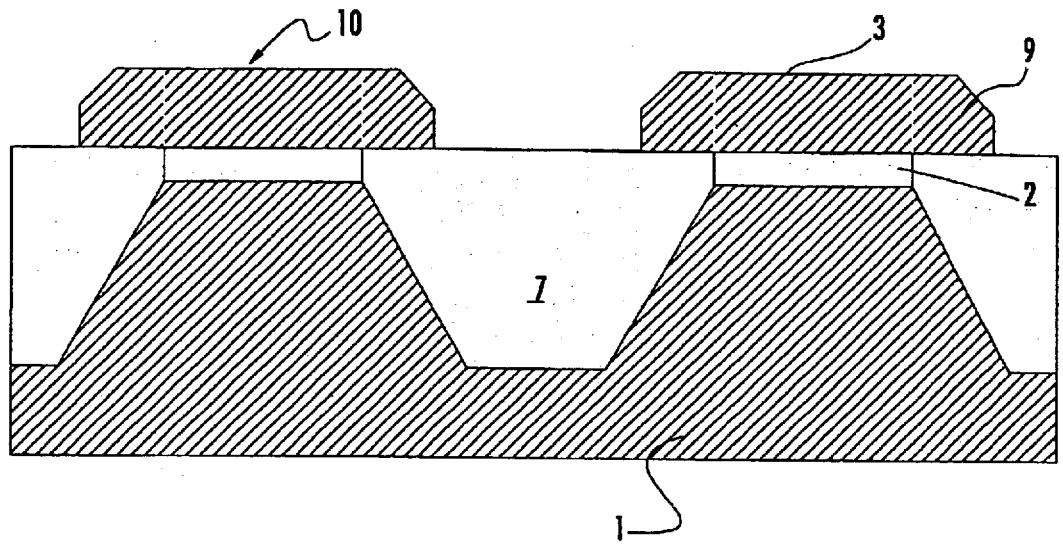

The nitride layer 4 is then etched away by selective chemical etching as shown in FIG. 9, and a second layer 8 of polysilicon is deposited as shown in FIG. 10. The second polysilicon layer 8 is short-circuited to the first polysilicon layer 3. Advantageously, the thickness of the second polysilicon layer 8 is equal to that of the first polysilicon layer 3, i.e., in the range of hundreds of nanometers, e.g., 100 to 150 nm.

At this point, according to the present invention, the second polysilicon layer 8 is etched away for a thickness equal to that of the deposited layer 8, e.g., using an etch-back method. Consequently, extensions 9 are formed adjacent to the first polysilicon layer 3, over the isolation layer 7. Thus, a floating gate region 10 is formed, which comprises a first portion located above the active area formed from the first polysilicon area, and has extensions 9 lying over the isolation layer formed from the second polysilicon layer.

As shown in FIG. 1, a cell fabricated in accordance with the invention has a smaller active area width Waa than the distance Saa between contiguous floating gate regions, and has a greater floating gate region width Wfg than the distance Sfg between contiguous floating gate regions. This dimensional feature is made necessary by the fact that the dimension of the floating gate region along the x direction contributes to define the capacitive coupling to the control gate. This is a fundamental parameter to the proper dimensioning of the cell.

Figure 12:
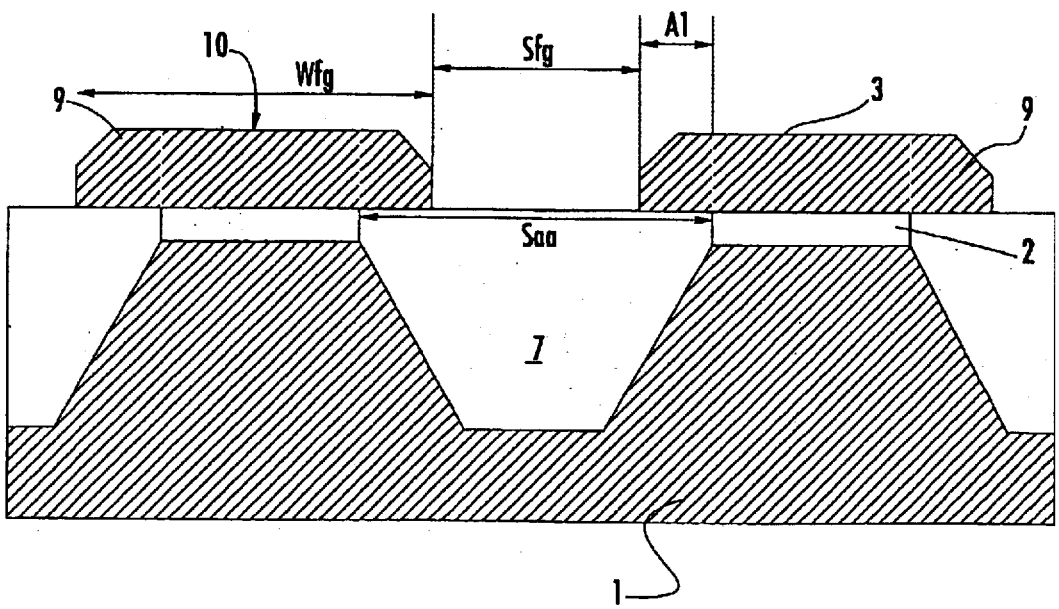

Thus, it will be appreciated that the two critical dimensions along the x direction of the cell, Al and Sfg as shown in FIG. 12, are no longer defined by lithographic operations involving serious alignment problems, but rather by depositing and etching operations. In addition, neither dimensions of the extensions and the floating gate region are defined by masking, but rather by the thickness of the polysilicon films deposited.

Referring to K as the thickness of the polysilicon film deposited (both the first and second layers), the dimensions of the extensions will equal K, and the dimension of the distance between floating gate regions will equal Saa−2K, where Saa is the distance between active areas.

Figure 13:
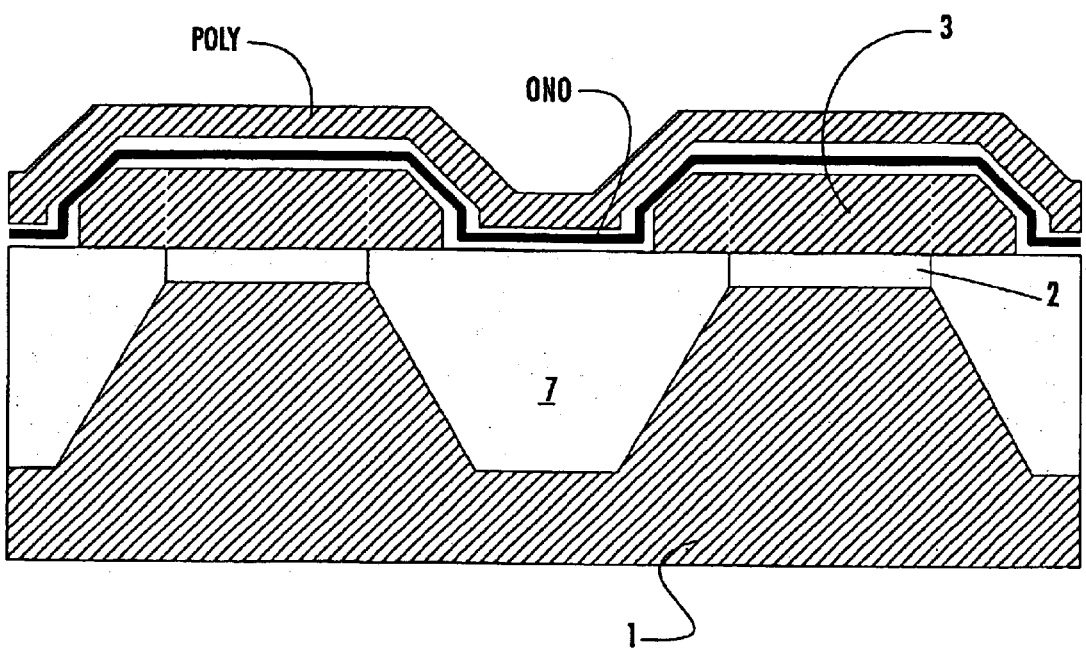

As shown in FIG. 13, the process of this invention is continued through the same steps as a conventional process for fabricating non-volatile memory cells, and the sequence of steps that lead to a completed memory device are outlined below. The process comprises depositing a dielectric layer, such as ONO, and then depositing a polysilicon layer to form the control gate region, implanting the source and drain regions of the cell, and defining the contacts and metal lines.

To summarize, the fabricating process set forth above solves the above described technical problem, and offers a number of advantages. A major advantage of a memory cell fabricated thereby is that the capacitive coupling of the floating gate region to the control region can be maximized, as shown in FIG. 13. In particular, this can be achieved by maximizing dimension Al and minimizing dimension Sfg, with a suitably selected thickness K.

That which is claimed is:

1. A memory device comprising:
   a substrate; and
   a plurality of memory cells in said substrate arranged in rows and columns to define a matrix of memory cells, each memory cell comprising
      a floating gate defined by a stacked structure comprising a first dielectric layer, and a first conducting layer isolated from said substrate by the first dielectric layer,
      at least one trench in said substrate adjacent said floating gate,
      a second dielectric layer in said at least one trench, and
      conductive extensions contacting said first conducting layer of said floating gate and extending laterally outwardly therefrom over adjacent portions of said second dielectric layer, said conductive extensions having upper surface portions being substantially coplanar with adjacent upper surface portions of said first conducting layer of said floating gate, said conductive extensions having a thickness substantially equal to a thickness of said first conducting layer of said floating gate.

2. A memory device according to claim 1, wherein said conductive extensions each comprises a second conducting layer; and wherein said first and second conducting layers each comprises polysilicon.

3. A memory device according to claim 1, wherein said first and second dielectric layers each comprises oxide.

4. A memory device according to claim 1, wherein said at least one trench has sloping sidewalls.

5. A memory device according to claim 4, wherein an angle of the sloping sidewalls is in a range of about 60 to 90 degrees with respect to said substrate.

6. An integrated circuit comprising:

a semiconductor substrate; and a plurality of memory cells in said semiconductor substrate arranged in rows and columns to define a matrix of memory cells, each memory cell comprising a floating gate defined by a stacked structure comprising a first dielectric layer, and a first conducting layer isolated from said semiconductor substrate by the first dielectric layer, at least one trench in said semiconductor substrate adjacent said floating gate and having sloping sidewalls, a second dielectric layer in said at least one trench, and conductive extensions contacting said first conducting layer of said floating gate and extending laterally outwardly therefrom over adjacent portions of said second dielectric layer, said conductive extensions having upper surface portions being substantially coplanar with adjacent upper surface portions of said first conducting layer of said floating gate, said conductive extensions having a thickness substantially equal to a thickness of said first conducting layer of said floating gate.

7. An integrated circuit according to claim 6, wherein said conductive extensions each comprises a second conducting layer; and wherein said first and second conducting layers each comprises polysilicon.

8. An integrated circuit according to claim 6, wherein said first and second dielectric layers each comprises oxide.

9. An integrated circuit according to claim 6, wherein an angle of the sloping sidewalls is in a range of about 60 to 90 degrees with respect to said semiconductor substrate.

* * * * *